US011023760B2

(12) United States Patent
Sanada

(10) Patent No.: US 11,023,760 B2
(45) Date of Patent: Jun. 1, 2021

(54) MAGNETIC INK READING DEVICE AND PRINTER

(71) Applicant: TOSHIBA TEC KABUSHIKI KAISHA, Tokyo (JP)

(72) Inventor: Tsuyoshi Sanada, Susono Shizuoka (JP)

(73) Assignee: TOSHIBA TEC KABUSHIKI KAISHA, Tokyo (JP)

( * ) Notice: Subject to any disclaimer, the term of this patent is extended or adjusted under 35 U.S.C. 154(b) by 64 days.

(21) Appl. No.: 16/417,951

(22) Filed: May 21, 2019

(65) Prior Publication Data

US 2019/0362174 A1   Nov. 28, 2019

(30) Foreign Application Priority Data

May 22, 2018   (JP) .............................. JP2018-097626

(51) Int. Cl.
*G06K 9/18*   (2006.01)
*G06K 1/12*   (2006.01)
(Continued)

(52) U.S. Cl.
CPC ............ *G06K 9/186* (2013.01); *B41J 15/048* (2013.01); *G01R 33/02* (2013.01); *G01R 33/12* (2013.01); *G06K 1/125* (2013.01)

(58) Field of Classification Search
CPC .. G06K 3/00; G06K 7/00; G06K 7/08; G06K 19/00
(Continued)

(56) References Cited

U.S. PATENT DOCUMENTS

2005/0141934 A1*   6/2005   Kim .................... G03G 15/2053
399/330
2005/0207634 A1*   9/2005   Jones ..................... G06Q 20/18
382/135
(Continued)

FOREIGN PATENT DOCUMENTS

JP   2001-283401   10/2001
JP   2004-206316   7/2004

OTHER PUBLICATIONS

Chinese Office Action for Chinese Patent Application No. 201910423301.8 dated Jun. 24, 2020.

*Primary Examiner* — Edwyn Labaze
(74) *Attorney, Agent, or Firm* — Amin, Turocy & Watson, LLP

(57) ABSTRACT

In accordance with an embodiment, a magnetic ink reading device comprises a conveyance mechanism configured to convey a sheet-like medium printed by using magnetic ink along a conveyance path; a magnetizing mechanism configured to magnetize the magnetic ink on the medium along the conveyance path; a magnetic detection head, arranged in the vicinity of the magnetizing mechanism along the conveyance path, configured to read magnetism of the magnetized magnetic ink; a cylindrical roller member, arranged to face the magnetic detection head across the conveyance path, configured to press the medium conveyed along the conveyance path against the magnetic detection head to be capable of rotating along the surface of the medium; and a rotating shaft configured to rotatably support the roller member and contact an inner wall of the roller member at the axial center of the roller member.

20 Claims, 3 Drawing Sheets

(51) Int. Cl.
*B41J 15/04* (2006.01)
*G01R 33/02* (2006.01)
*G01R 33/12* (2006.01)

(58) Field of Classification Search
USPC ......... 235/449, 439, 435, 375; 382/135–140, 382/181
See application file for complete search history.

(56) References Cited

U.S. PATENT DOCUMENTS

| | | | |
|---|---|---|---|
| 2014/0116840 A1* | 5/2014 | Maekawa | G07D 7/164 194/320 |
| 2019/0073548 A1 | 3/2019 | Sanada et al. | |

* cited by examiner

MAGNETIC INK READING DEVICE AND PRINTER

CROSS-REFERENCE TO RELATED APPLICATION

This application is based upon and claims the benefit of priority from Japanese Patent Application No. 2018-097626, filed on May 22, 2018, the entire contents of which are incorporated herein by reference.

FIELD

Embodiments described herein relate generally to a magnetic ink reading device for reading magnetic ink characters and images printed on a slip of paper and the like and a printer.

BACKGROUND

On a surface of a medium such as a handprint or a check, a character (MICR character: Magnetic Ink character recognition) may be printed using magnetic ink in some cases. Such an MICR character is read by a magnetic ink reading device as follows. Specifically, when a user inserts the medium into the device, the magnet magnetizes the MICR characters. Next, a remaining magnetic field generated by remaining magnetism of the MICR character is detected by a magnetic detection head (MICR head), and the device recognizes the MICR character from its magnetic characteristics and magnetic pattern. The device can distinguish between the handprint and the check according to the MICR character.

Such a magnetic ink reading device is incorporated in a printer in an ATM (Automatic Teller Machine) or a POS (point of sale) to be used, for example.

In the printer, a magnet, a magnetic detection head, a feed roller, a pinch roller, an inkjet head and a platen are arranged along a conveyance path. A motor for driving the feed roller is provided.

A strong permanent magnet is used as the magnet to stably magnetize the MICR character. The magnet and the magnetic detection head are provided corresponding to a position of the MICR character on the medium to be conveyed on the conveyance path.

In the printer configured as described above, by magnetizing the MICR character and detecting a remaining magnetic field, reading and printing are performed. In such a printer, since the accuracy of reading of the MICR character is required, it is necessary to enable the magnetic detection head to contact the MICR character stably.

In order to enable the magnetic detection head to contact the MICR character stably, a pressing pad is arranged to face the magnetic detection head, and the MICR character and the magnetic detection head contact with each other by a pressing force thereof. In particular, when there are some wrinkles on a medium, it is necessary to increase the pressing force to reliably press the medium against the magnetic detection head.

However, if the pressing force from the pressing pad is excessively increased, imbalance occurs in a width direction (a direction orthogonal to a conveyance direction) of the medium, and the medium may be skewed in some cases. If the medium is skewed, there is a possibility that the accuracy of reading by the magnetic detection head decreases.

Therefore, there is a need for a device capable of stably performing the reading operation without causing skew in the medium even if the pressing force applied to the medium against the magnetic detection head is increased.

DETAILED DESCRIPTION

In accordance with an embodiment, a magnetic ink reading device comprises a conveyance mechanism configured to convey a sheet-like medium printed by using magnetic ink along a conveyance path; a magnetizing mechanism configured to magnetize the magnetic ink on the medium along the conveyance path; a magnetic detection head, arranged in the vicinity of the magnetizing mechanism along the conveyance path, configured to read magnetism of the magnetized magnetic ink; a cylindrical roller member, arranged to face the magnetic detection head across the conveyance path, configured to press the medium conveyed along the conveyance path against the magnetic detection head to be capable of rotating along the surface of the medium; and a rotating shaft configured to rotatably support the roller member and contact an inner wall of the roller member at the axial center of the roller member.

Hereinafter, an embodiment is described with reference to the accompanying drawings.

Figure 1:
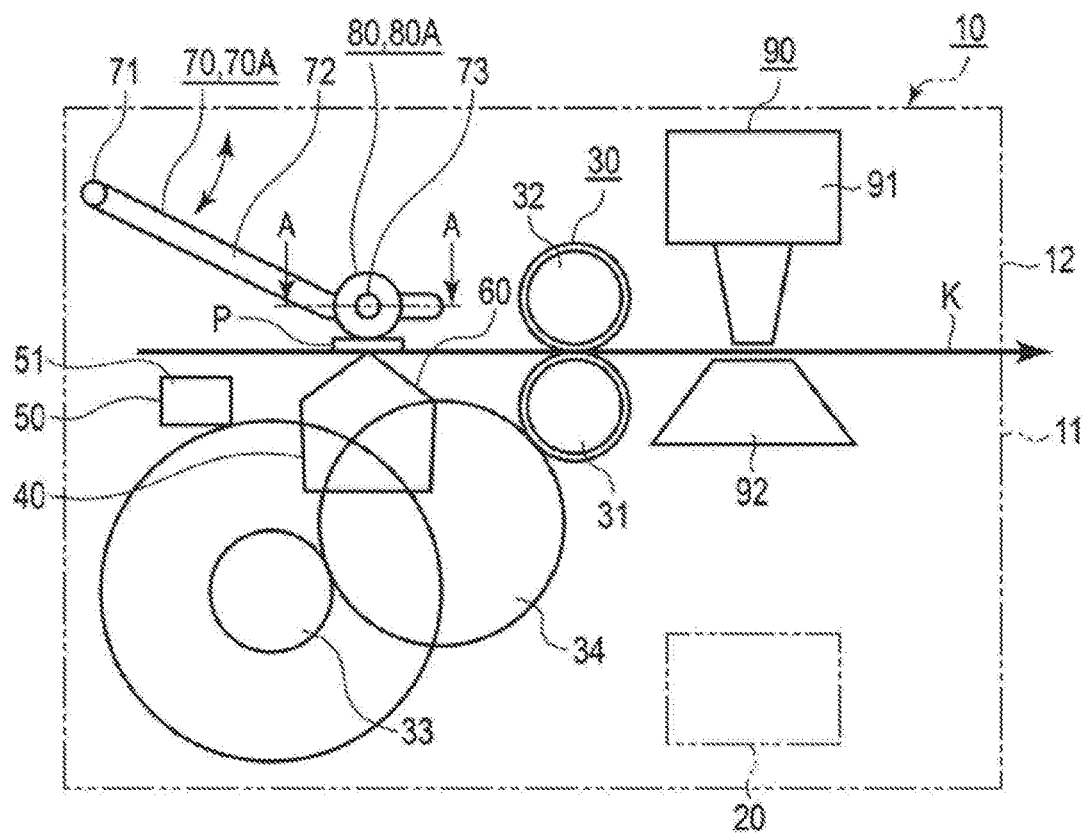
FIG. 1 is a diagram schematically illustrating a configuration of a printer provided with a magnetic ink reading device according to an embodiment.
Figure 2:
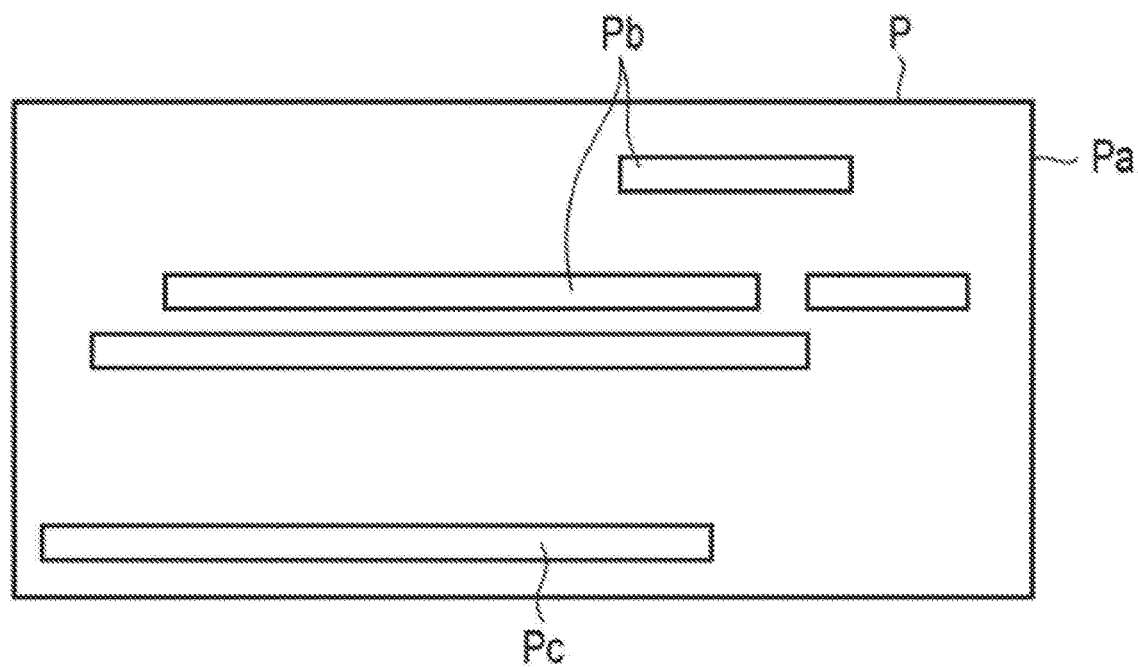
FIG. 2 is a plan view illustrating an example of a printed medium applicable to the magnetic ink reading device according to the present embodiment.
Figure 3:
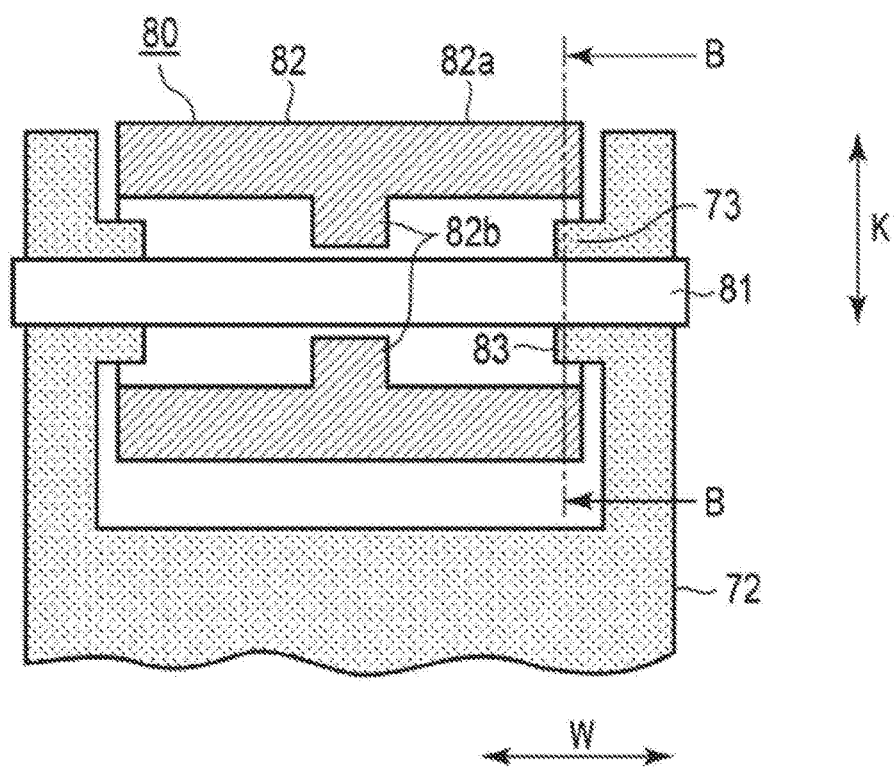
FIG. 3 is a cross-sectional view taken along a line A-A in FIG. 1 and viewed in a direction indicated by an arrow to show a pressing roller mechanism incorporated into the magnetic ink reading device according to the present embodiment.
Figure 4:
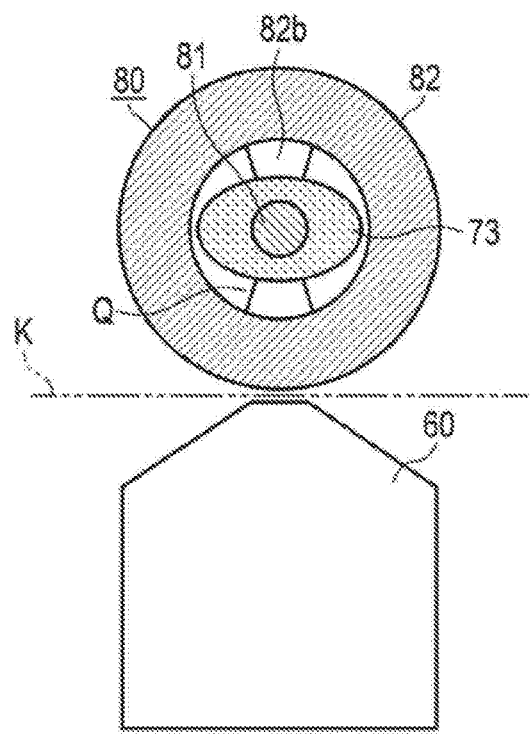
FIG. 4 is a cross-sectional view taken along a line B-B in FIG. 3 and viewed in a direction indicated by an arrow to show the pressing roller mechanism and a MICR head according to the present embodiment.

FIG. 1 is a diagram schematically illustrating a configuration of a printer 10 provided with a magnetic ink reading device 40 according to the present embodiment; FIG. 2 is a plan view illustrating an example of a printed sheet-like medium P such as a handprint or a check applicable to the magnetic ink reading device 40 according to the present embodiment; FIG. 3 is a cross-sectional view taken along a line A-A in FIG. 1 and viewed in a direction indicated by an arrow to show a pressing roller mechanism 70 incorporated into the magnetic ink reading device 40; and FIG. 4 is a cross-sectional view taken along a line B-B in FIG. 3 and viewed in a direction indicated by an arrow to show the pressing roller mechanism 70 and a MICR head 60.

The printer 10 is incorporated in an ATM of a bank or a POS terminal in a retail store, a warehouse, or the like. In the drawing, K indicates a conveyance path of a medium P. As shown in FIG. 2, the medium P has a sheet-like medium body Pa. On this medium body Pa, characters Pb are printed by using normal ink and MICR characters Pc are printed by using magnetic ink.

The printer 10 has a housing 11. The conveyance path K is formed in the housing 11. The right end of the conveyance path K in FIG. 1 is provided with an entrance and exit 12 through which the medium P is inserted or discharged from the outside. A user inserts the medium P into the printer 10 with a surface thereof on which the printing is performed using the magnetic ink beforehand facing downward in FIG. 1.

A controller 20, a conveyance mechanism 30, the magnetic ink reading device 40 and a printing mechanism 90 are accommodated in the housing 11, and the printing mechanism 90 is provided at the entrance and exit 12 side of the magnetic ink reading device 40. The controller 20 has a function of cooperatively controlling the conveyance mechanism 30, the magnetic ink reading device 40 and the printing mechanism 90.

In the conveyance mechanism 30, a conveyance path K for conveying the sheet-like medium P printed using the magnetic ink is formed by a plurality of rollers including the feed roller 31 and the pinch roller 32. The conveyance mechanism 30 has a motor 33 and a gear mechanism 34 for transmitting a torque of the motor 33 to each roller.

The magnetic ink reading device 40 includes a magnetizing mechanism 50 for magnetizing the magnetic ink on the medium P on the conveyance path K, the MICR head 60 arranged in the vicinity of the downstream side in the conveyance direction of the conveyance path K of the magnetizing mechanism 50 to read the magnetism of the magnetized magnetic ink, and the pressing roller mechanism 70 which presses the medium P on the conveyance path K towards the MICR head 60 side.

The magnetizing mechanism 50 is provided with a magnet 51 arranged with an N pole surface or an S pole surface facing the surface of the medium P.

The MICR head 60 is arranged at a position away from one end in a width direction of the medium P by 7 to 9 mm.

The pressing roller mechanism 70 includes a support mechanism 71 arranged above the magnetizing mechanism 50 in FIG. 1, an arm 72 swingably attached to the support mechanism 71, and a pivot support portion 73 attached to the tip of the arm 72. The support mechanism 71 swings the arm 72 in a vertical direction at a predetermined timing using a cam mechanism (not shown).

A roller mechanism 80 is provided on the pivot support portion 73. For the pivot support portion 73 having an elliptical cross section, a long diameter extends along the conveyance direction K, and a minor diameter thereof is directed to the MICR head 60 side. The outer circumference on the long diameter side thereof internally contacts the inner circumferential wall of a roller 82 described later.

As shown in FIG. 3 and FIG. 4, the roller mechanism 80 includes a rotating shaft 81 made of an austenitic stainless steel material (SUS 304 or the like) and attached to the arm 72 in parallel with a width direction W of the medium P, and a roller 82 made of the resin and capable of rotating around the rotating shaft 81. Both the austenitic stainless steel material and the resin are nonmagnetic. Since the rotating shaft 81 and the roller 82 are nonmagnetic materials, they are not magnetized by leakage magnetic flux generated from surrounding motors, and fluctuation of the magnetic field in the vicinity of the MICR head 60 can be minimized. SUS 304 which is the austenitic stainless steel material is one of the optimum materials in consideration of cost and wear resistance.

The roller 82 includes a cylindrical roller main body 82a and a rib 82b provided on the inner circumferential surface side of the center in the width direction W of the roller main body 82a. The rib 82b faces the outer circumferential surface of the rotating shaft 81 with a small clearance.

Since a portion along the conveyance direction K on the inner circumferential surface of the roller 82 internally contacts the long diameter side of the pivot support portion 73 as described above, the roller 82 is regulated to move within a very short range in the conveyance direction K side. On the other hand, since a portion that intersects with the conveyance direction K on the inner circumferential surface of the roller 82 faces the minor diameter side of the pivot support portion 73, there is a relatively large clearance Q, and the roller 82 is permitted to move within a relatively long range on the MICR head 60 side. In other words, a clearance in the conveyance direction K is small, and the clearance in a direction orthogonal to the conveyance direction K is large.

The MICR head 60 detects the remaining magnetic force of the MICR character Pc. The MICR character Pc is read as a magnetic characteristic and a magnetic pattern, and the magnetic characteristic and the magnetic pattern is output as electric signals to the controller 20. The magnetic characteristic and the magnetic pattern of the MICR character Pc are registered in the controller 20 in advance, and the controller 20 collates the read magnetic characteristic and magnetic pattern with the registered magnetic characteristic and magnetic pattern to recognize the MICR character Pc in the controller 20.

The printing mechanism 90 includes an inkjet head 91 and a platen 92 facing the inkjet head 91 across the conveyance path K.

In the printer 10 configured as described above, the magnetic ink reading and the printing are performed in the following manner. Specifically, the user inserts the medium P from the entrance and exit 12 of the housing 11 with the surface on which the MICR character Pc is printed facing downward. The inserted medium P is conveyed by the conveyance mechanism 30 towards the left direction in FIG. 1 along the conveyance path K.

If the medium P reaches the magnetizing mechanism 50, the MICR character Pc passes through the magnetizing mechanism 50. At this time, the MICR character Pc is magnetized by the magnetic force of the magnet 51.

Next, the medium P is conveyed by the conveyance mechanism 30 in the right direction in FIG. 1, and the MICR character Pc reaches the MICR head 60. At this time, the arm 72 of the pressing roller mechanism 70 swings downward by the operation of the cam mechanism, and the roller 82 presses the medium P towards the MICR head 60 side. Here, the remaining magnetic field generated by the remaining magnetism of the MICR character Pc is detected by the MICR head 60. From the magnetic characteristic and the magnetic pattern of the remaining magnetism, the MICR character Pc is recognized. Based on the recognized MICR character Pc, the contents described on the medium P are determined.

When the medium P is conveyed by the conveyance mechanism 30 in the right direction in FIG. 1, and the medium P reaches the printing mechanism 90, depending on the determination result of the medium P described above, "used", "invalid" or the like is printed by the inkjet head 91.

The medium P after printing is discharged from the entrance and exit 12 of the housing 11 by the conveyance mechanism 30.

According to the printer 10 configured as described above, since the medium P is pressed against the MICR head 60 by the roller 82, the remaining magnetism applied to the MICR character Pc can be accurately read by the MICR head 60. Therefore, even if there are some wrinkles on the medium P, it is possible to minimize the possibility of the occurrence of erroneous recognition and an error.

Further, even if a strong pressing force is applied by the roller 82, the roller 82 can smoothly rotate on the medium P, and thus, no unbalanced force is generated on the medium P. As a result, no skew occurs and the reading is performed with high accuracy. Furthermore, since the roller 82 is supported at the center by the rotating shaft 81, the roller 82 can follow the MICR head 60 on the conveyance path K even if the MICR head 60 is slightly inclined in the width direction. Therefore, no clearance is generated between the medium P and the MICR head 60, and reading can be performed with high accuracy.

Figure 5:
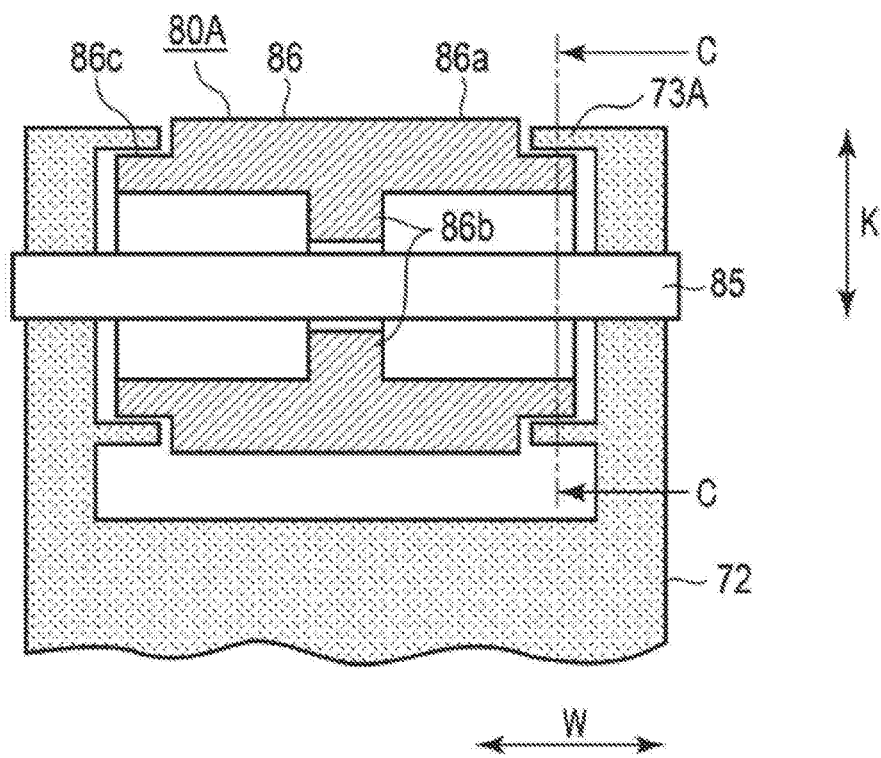
FIG. 5 is a sectional view taken along a line A-A in FIG. 1 and viewed in a direction indicated by an arrow to show a modification of a pressing roller mechanism incorporated into the magnetic ink reading device.
Figure 6:
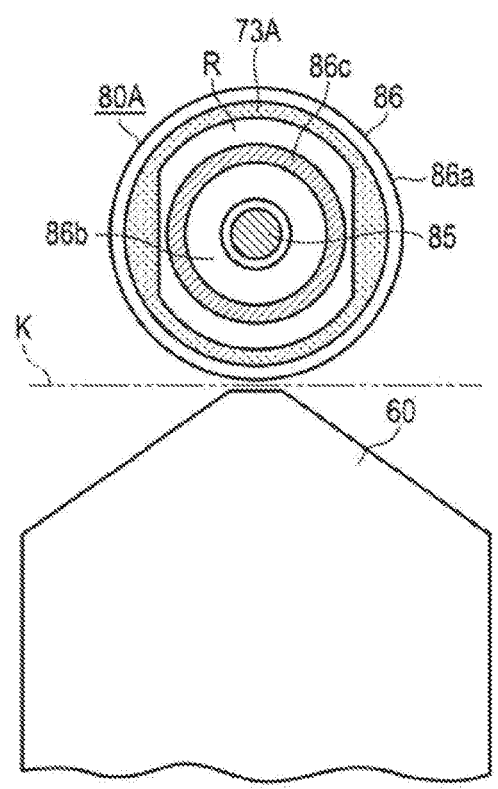
FIG. 6 is a cross-sectional view taken along a line C-C in FIG. 5 and viewed in a direction indicated by an arrow to show the pressing roller mechanism and the MICR head.

FIG. 5 is a sectional view taken along the line A-A in FIG. 1 and viewed in a direction indicated by an arrow to show a modification of the pressing roller mechanism incorporated into the magnetic ink reading device 40; and FIG. 6 is a cross-sectional view taken along a line C-C in FIG. 5 and viewed in a direction indicated by an arrow to show the pressing roller mechanism 70 and the MICR head 60. In FIG. 5 and FIG. 6, the same functional components as those in FIG. 3 and FIG. 4 are denoted with the same reference numerals, and detailed description thereof is omitted below.

In a pressing roller mechanism 70A, a pivot support portion 73A is provided instead of the above-described pivot support portion 73, and a roller mechanism 80A is provided instead of the roller mechanism 80.

The pivot support portion 73A is formed in an elongated hole shape while its minor diameter is along the conveyance direction K, and its long diameter is directed towards the MICR head 60 side. The outer circumference on the minor diameter side thereof internally contacts the inner circumferential wall of a roller 86 described later.

As shown in FIG. 5 and FIG. 6, the roller mechanism 80A has a rotating shaft 85 made of an austenitic stainless steel material (SUS 304 or the like) and arranged in the arm 72 in parallel with the width direction W of the medium P, and the roller 86 made of the resin and capable of rotating around the rotating shaft 85. Both the austenitic stainless steel material and the resin are nonmagnetic. Since they are nonmagnetic materials, they are not affected by electromagnetic force generated from motors and the like in the vicinity.

The roller 86 includes a cylindrical roller main body 86a, and a rib 86b provided at the inner side in the center in the width direction W of the roller main body 86a. The rib 86b faces the outer circumferential surface of the rotating shaft 85 with a small clearance therebetween. Stepped portions 86c are formed on the outer circumference at both ends of the roller main body 86a, and externally contact the inner circumferential surface of the pivot support portion 73A.

Since the portion along the conveyance direction K of the outer circumferential surface of the roller 86 externally contacts the minor diameter side of the inner circumference of the pivot support portion 73A as described above, the roller 86 is regulated to move in an extremely short range in the conveyance direction K side. On the other hand, the portion of the outer circumferential surface of the roller 86 along the direction intersecting with the conveyance direction K faces the long diameter side of the pivot support portion 73A, and in this way, there is a relatively large clearance R therebetween, and the roller 86 is permitted to move within a relatively large range on the MICR head 60 side. Specifically, the clearance in the conveyance direction K is small, and the clearance in the direction orthogonal to the conveyance direction K is large.

By using the pressing roller mechanism 70A configured as described above, it is possible to achieve the same effect as in the case of using the pressing roller mechanism 70 described above.

In the above examples, the rollers 82 and 86 are made of the resin, and the rotating shafts 81 and 85 are made of the austenitic stainless steel material; however, any other materials may be used as long as they are nonmagnetic materials. The outer circumference of the above-described roller 86 internally contacts the pivot support portion 73A in the front and rear directions of the conveyance direction K, but they may contact with each other in either one of the front and rear directions.

While certain embodiments have been described, these embodiments have been presented by way of example only, and are not intended to limit the scope of the invention. Indeed, the novel embodiments described herein may be embodied in a variety of other forms; furthermore, various omissions, substitutions and changes in the form of the embodiments described herein may be made without departing from the spirit of the invention. The accompanying claims and their equivalents are intended to cover such forms or modifications as would fall within the scope and spirit of the invention.

What is claimed is:

1. A magnetic ink reading device, comprising:
   a conveyance mechanism configured to convey a sheet-like medium having magnetic ink thereon along a conveyance path;
   a magnetizing mechanism configured to magnetize the magnetic ink on the sheet-like medium along the conveyance path;
   a magnetic detection head, arranged along the conveyance path, configured to read magnetism of magnetized magnetic ink on the sheet-like medium;
   a cylindrical roller, arranged to face the magnetic detection head across the conveyance path, configured to press the sheet-like medium conveyed along the conveyance path against the magnetic detection head so as to be rotatable along the surface of the sheet-like medium; and
   a rotating shaft configured to rotatably support the cylindrical roller and contact an inner wall of the cylindrical roller at the axial center of the cylindrical roller.

2. The magnetic ink reading device according to claim 1, wherein
   the cylindrical roller is supported at both ends thereof in such a manner that an inner circumferential surface side thereof internally contacts a pivot support portion having an elliptical cross section, and
   the pivot support portion is provided within a long diameter of the elliptical cross section extending along the conveyance path.

3. The magnetic ink reading device according to claim 1, wherein
   the cylindrical roller is supported at both ends thereof in such a manner that an outer circumferential surface side thereof externally contacts a pivot support portion having an elongated hole shape, and
   the pivot support portion is provided within a minor diameter of the elliptical cross section extending along the conveyance path.

4. The magnetic ink reading device according to claim 1, wherein the roller member and the rotating shaft comprise non-magnetic materials.

5. The magnetic ink reading device according to claim 1, wherein
the rotating shaft comprises an austenitic stainless steel material.

6. The magnetic ink reading device according to claim 1, wherein
the cylindrical roller comprises a non-magnetic resin.

7. The magnetic ink reading device according to claim 1, wherein
the cylindrical roller has stepped portions formed on the outer circumference at both ends thereof.

8. The magnetic ink reading device according to claim 1, wherein
the magnetic ink reading device is comprised in a POS terminal.

9. The magnetic ink reading device according to claim 1, wherein
the magnetic ink reading device is comprised in an automated teller machine.

10. The magnetic ink reading device according to claim 1, wherein the inner wall of the cylindrical roller comprises a rib intervening between the inner wall and an outer circumferential surface of the rotating shaft with a clearance between the rib and the outer circumferential surface.

11. The magnetic ink reading device according to claim 10, wherein the cylindrical roller is supported at both ends thereof in such a manner that an inner circumferential surface side thereof internally contacts a pivot support portion in a transport direction or that an outer circumferential surface side thereof externally contacts the pivot support portion in the transport direction, and wherein the pivot support portion has an elliptical cross section and is provided within a long diameter of the elliptical cross section extending along the conveyance path.

12. A printer, comprising:
a conveyance mechanism configured to convey a sheet-like medium having magnetic ink thereon along a conveyance path;
a magnetizing mechanism configured to magnetize the magnetic ink on the sheet-like medium along the conveyance path;
a magnetic detection head, arranged along the conveyance path, configured to read magnetism of the magnetized magnetic ink;
a printing mechanism, arranged on the conveyance path, configured to perform printing on the sheet-like medium;
a cylindrical roller, arranged to face the magnetic detection head across the conveyance path, configured to press the sheet-like medium conveyed along the conveyance path against the magnetic detection head so as to be rotatable along the surface of the sheet-like medium; and
a rotating shaft configured to rotatably support the cylindrical roller and contact an inner wall of the cylindrical roller at the axial center of the cylindrical roller.

13. The printer according to claim 12, wherein
the cylindrical roller is supported at both ends thereof in such a manner that an inner circumferential surface side thereof internally contacts a pivot support portion having an elliptical cross section, and
the pivot support portion is provided within a long diameter of the elliptical cross section extending along the conveyance path.

14. The printer according to claim 12, wherein
the cylindrical roller is supported at both ends thereof in such a manner that an outer circumferential surface side thereof externally contacts a pivot support portion having an elongated hole shape, and
the pivot support portion is provided within a minor diameter of the elliptical cross section extending along the conveyance path.

15. The printer according to claim 12, wherein the inner wall of the cylindrical roller comprises a rib intervening between the inner wall and an outer circumferential surface of the rotating shaft with a clearance between the rib and the outer circumferential surface.

16. The printer according to claim 15, wherein the cylindrical roller is supported at both ends thereof in such a manner that an inner circumferential surface side thereof internally contacts a pivot support portion in a transport direction or that an outer circumferential surface side thereof externally contacts the pivot support portion in the transport direction, and wherein the pivot support portion has an elliptical cross section and is provided within a long diameter of the elliptical cross section extending along the conveyance path.

17. A magnetic ink processing method, comprising:
conveying a sheet-like medium having magnetic ink thereon along a conveyance path;
magnetizing the magnetic ink on the sheet-like medium along the conveyance path;
reading magnetism of magnetized magnetic ink on the sheet-like medium using a magnetic detection head arranged along the conveyance path;
pressing the sheet-like medium conveyed along the conveyance path against the magnetic detection head so as to be rotatable along the surface of the sheet-like medium using a cylindrical roller arranged to face the magnetic detection head across the conveyance path; and
rotatably supporting the cylindrical roller and contacting an inner wall of the cylindrical roller at the axial center of the cylindrical roller using a rotating shaft.

18. The magnetic ink processing method according to claim 17, further comprising:
internally contacting a pivot support portion having an elliptical cross section with an inner circumferential surface side of the cylindrical roller.

19. The magnetic ink processing method according to claim 17, wherein the inner wall of the cylindrical roller comprises a rib intervening between the inner wall and an outer circumferential surface of the rotating shaft with a clearance between the rib and the outer circumferential surface.

20. The magnetic ink processing method according to claim 19, further comprising:
internally contacting a pivot support portion having an elliptical cross section with an inner circumferential surface side of an end of the cylindrical roller in a transport direction; or
externally contacting the pivot support portion with an outer circumferential surface side of the end of the cylindrical roller in the transport direction.

* * * * *